United States Patent
Wu (10) Patent No.: US 9,520,320 B2
(45) Date of Patent: Dec. 13, 2016

(54) TFT ARRAY SUBSTRATE, METHOD OF MANUFACTURING THE SAME, AND DISPLAY DEVICE

(71) Applicants: Xiamen Tianma Micro-Electronics Co., Ltd., Xiamen (CN); Tianma Micro-Electronics Co., Ltd., Shenzhen (CN)

(72) Inventor: Hao Wu, Xiamen (CN)

(73) Assignees: XIAMEN TIANMA MICRO-ELECTRONICS CO., LTD., Xiamen (CN); TIANMA MICRO-ELECTRONICS CO., LTD., Shenzhen (CN)

(*) Notice: Subject to any disclaimer, the term of this patent is extended or adjusted under 35 U.S.C. 154(b) by 0 days.

(21) Appl. No.: 14/302,386

(22) Filed: Jun. 11, 2014

(65) Prior Publication Data
US 2015/0187640 A1   Jul. 2, 2015

(30) Foreign Application Priority Data
Dec. 31, 2013   (CN) .......................... 2013 1 0753156

(51) Int. Cl.
*H01L 21/768* (2006.01)
*H01L 27/12* (2006.01)

(52) U.S. Cl.
CPC ... *H01L 21/76805* (2013.01); *H01L 21/76877* (2013.01); *H01L 27/124* (2013.01); *H01L 27/1288* (2013.01)

(58) Field of Classification Search
CPC .................... H01L 29/78654; H01L 21/76805; H01L 21/76877; G02F 1/133555
USPC .......................... 257/59, 72; 438/30, 34, 675
See application file for complete search history.

(56) References Cited

U.S. PATENT DOCUMENTS

| | | | | |
|---|---|---|---|---|
| 2008/0118996 | A1* | 5/2008 | Ishiga | G02F 1/133555 438/30 |
| 2014/0042444 | A1* | 2/2014 | Huang | H01L 29/78654 257/59 |

FOREIGN PATENT DOCUMENTS

CN           103094287 A        5/2013

* cited by examiner

*Primary Examiner* — Kenneth Parker
*Assistant Examiner* — Young W Kim
(74) *Attorney, Agent, or Firm* — Alston & Bird LLP (57) ABSTRACT

A TFT substrate and a method of manufacturing the TFT array substrate are disclosed. The method includes providing a substrate, forming an organic layer on the substrate, forming a first transparent conductive layer on the organic layer, and forming a photolithography layer on the first transparent conductive layer, where the photolithography layer has an opening. The method also includes patterning the first transparent conductive layer to form a first via hole in the first transparent layer using the photolithography layer as a mask, where the first via hole is aligned with the opening in the photolithography layer, and patterning the organic layer to form a second via hole in the organic using the photolithography layer as a mask, where the second via hole is aligned with the opening in the photolithography layer.

18 Claims, 6 Drawing Sheets

TFT ARRAY SUBSTRATE, METHOD OF MANUFACTURING THE SAME, AND DISPLAY DEVICE

CROSS-REFERENCES TO RELATED APPLICATIONS

This application claims the benefit of priority to Chinese Patent Application No. 201310753156.2 filed with the Chinese Patent Office on Dec. 31, 2013 and entitled "TFT Array Substrate, Method Of Manufacturing The Same, And Display Device", the content of which is incorporated herein by reference in its entirety.

TECHNICAL FIELD

The present disclosure relates to the field of display technologies, in particular to a Thin Film Transistor (TFT) array substrate, a method of manufacturing the same, and a display device.

BACKGROUND OF THE INVENTION

With the development of manufacture technologies of a display device, the display device including a TFT array substrate has been popular in the current display device market due to its advantages such as a small volume, low power consumption, and a high resolution.

In a practical application, it has been found that there is a trace mura phenomenon on the display device, thereby impacting a display effect and degrading a display quality.

BRIEF SUMMARY OF THE INVENTION

One inventive aspect is a method of manufacturing a TFT array substrate. The method includes providing a substrate forming an organic layer on the substrate forming a first transparent conductive layer on the organic layer, and forming a photolithography layer on the first transparent conductive layer, where the photolithography layer has an opening. The method also includes patterning the first transparent conductive layer to form a first via hole in the first transparent layer using the photolithography layer as a mask, where the first via hole is aligned with the opening in the photolithography layer, and patterning the organic layer to form a second via hole in the organic using the photolithography layer as a mask, where the second via hole is aligned with the opening in the photolithography layer.

Another inventive aspect is a TFT array substrate. The TFT array substrate includes a substrate and a drain disposed on the substrate, and an organic layer, which is disposed on the drain, where the organic layer includes a second via hole, and where the second via hole extends through the organic layer to expose the drain. The TFT substrate also includes a first transparent conductive layer disposed on the organic layer and including a first via hole, where the first via hole is aligned with the second via hole. The TFT substrate also includes an insulation layer disposed on the first transparent conductive layer and the drain, and including a third via hole, where the third via hole extends through the insulation layer to expose the drain. The TFT substrate also includes a second transparent conductive layer disposed on the insulation layer, the first transparent conductive layer, and the drain, where the second transparent conductive layer is connected to the drain through the first via hole, the second via hole, and the third via hole, and is insulated from the first transparent conductive layer by the insulation layer.

Another inventive aspect is a display device including a TFT array substrate. The TFT array substrate includes a substrate and a drain disposed on the substrate, and an organic layer, which is disposed on the drain, where the organic layer includes a second via hole, and where the second via hole extends through the organic layer to expose the drain. The TFT substrate also includes a first transparent conductive layer disposed on the organic layer and including a first via hole, where the first via hole is aligned with the second via hole. The TFT substrate also includes an insulation layer disposed on the first transparent conductive layer and the drain, and including a third via hole, where the third via hole extends through the insulation layer to expose the drain. The TFT substrate also includes a second transparent conductive layer disposed on the insulation layer, the first transparent conductive layer, and the drain, where the second transparent conductive layer is connected to the drain through the first via hole, the second via hole, and the third via hole, and is insulated from the first transparent conductive layer by the insulation layer.

DETAILED DESCRIPTION OF THE PREFERRED EMBODIMENTS

Technical solutions of the present disclosure will be further illustrated through specific embodiments below in conjunction with the accompanying drawings. It may be understood that specific embodiments described herein are merely for explaining the present disclosure rather than limiting the present disclosure. In addition, it should be illustrated that merely partial content associated with the present disclosure rather than all contents is illustrated in the accompanying drawings for ease of description.

The embodiments of the present disclosure are not limited to a Low Temperature Poly-Silicon (LTPS) TFT array substrate, or to a TFT with a top-gate structure or bottom-gate structure. Instead, the embodiments of the present disclosure can be applied to a display device such as an organic light emitting display (OLED), a liquid crystal display device and an electronic paper and so on.

Figure 1:
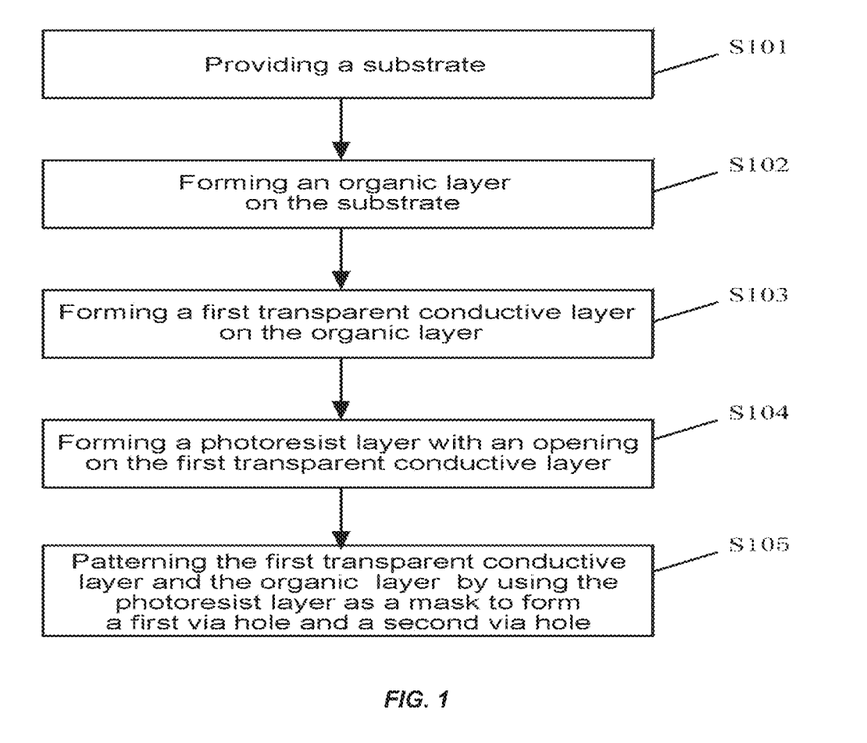
FIG. 1 is a flow chart illustrating a method of manufacturing a TFT array substrate according to an embodiment of the present disclosure.

FIG. 1 is a flow chart illustrating a method of manufacturing a TFT array substrate according to an embodiment of the present disclosure, and FIGS. 2a to 2h show cross-sectional views of a TFT array substrate in the process of manufacture according to an embodiment of the present disclosure.

Referring to the FIG. 1 and FIGS. 2a to 2h, an embodiment of the present disclosure provides a method of manufacturing a TFT array substrate, and the method includes the following Steps S101 to S105.

Step S101: providing a substrate.

Step S102: forming an organic layer 14 on the substrate.

Figure 2A:
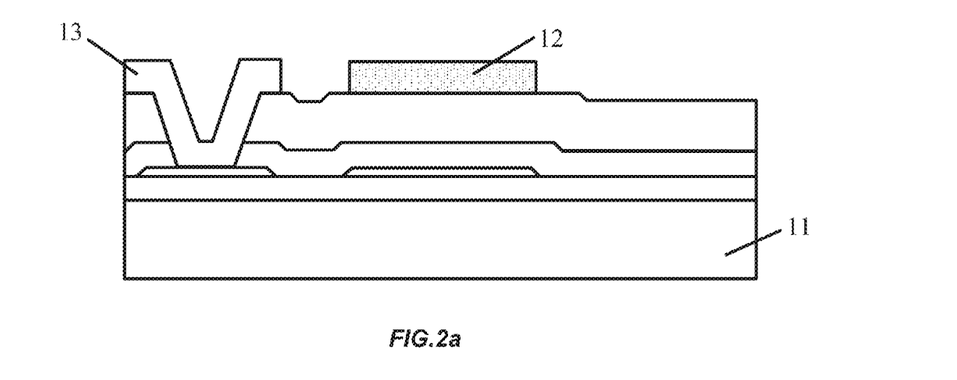
FIGS. 2a to 2h show cross-sectional views of a TFT array substrate in the process of manufacture according to an embodiment of the present disclosure.
Figure 2B:
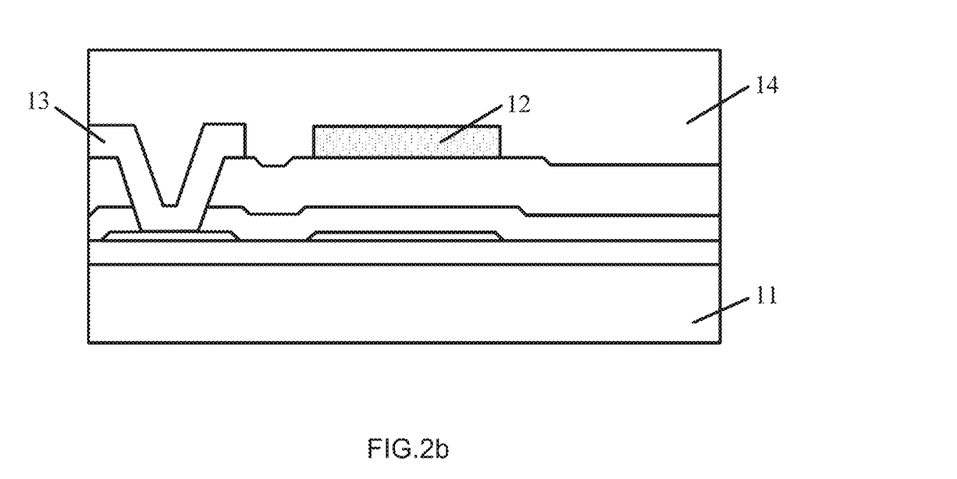

As shown in FIG. 2a, a gate, an active layer, a source 13 and a drain 12 are typically preformed on a substrate 11. Then the organic layer 14 is formed on the source 13 and the drain 12. The formed organic layer 14 is generally subjected to chemical mechanical planarization (CMP) so as to form a planarized surface layer. The organic layer 14 may be made of non-photosensitive resin. The formed organic layer 14 needs to be hardened. The cross-sectional view of the TFT array substrate formed with the organic layer 14 is shown in FIG. 2b.

Step S103: forming a first transparent conductive layer 15 on the organic layer 14.

Figure 2C:
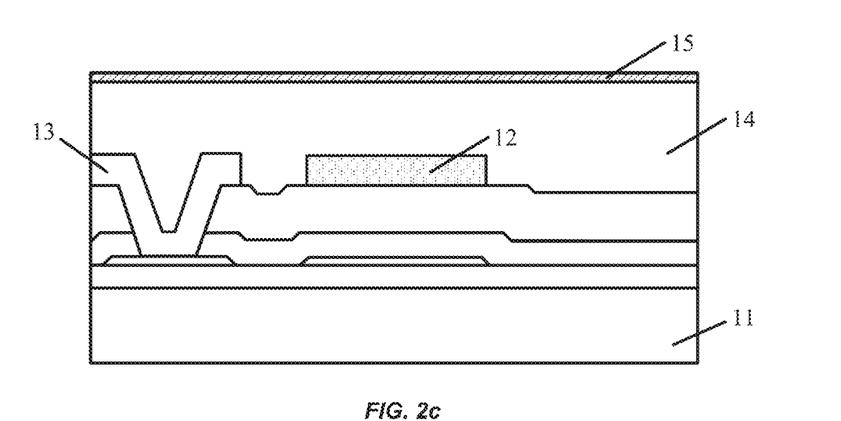

After the organic layer 14 is formed, the first transparent conductive layer 15 is formed as a common electrode of the TFT array substrate. The first transparent conductive layer 15 is made of Indium Tin Oxide (ITO) or Indium Zinc Oxide (IZO), or a combination of ITO and IZO. The first transparent conductive layer 15 may be formed by deposition or epitaxial growth technologies known in the art including, but not limited to, physical vapor deposition (PVD) and chemical vapor deposition (CVD). A cross-sectional view of the TFT array substrate formed with the transparent conductive layer 15 is shown in FIG. 2c.

Step S104: forming a photolithography layer (such as, a photoresist layer 16) with an opening on the first transparent conductive layer 15.

Figure 2D:
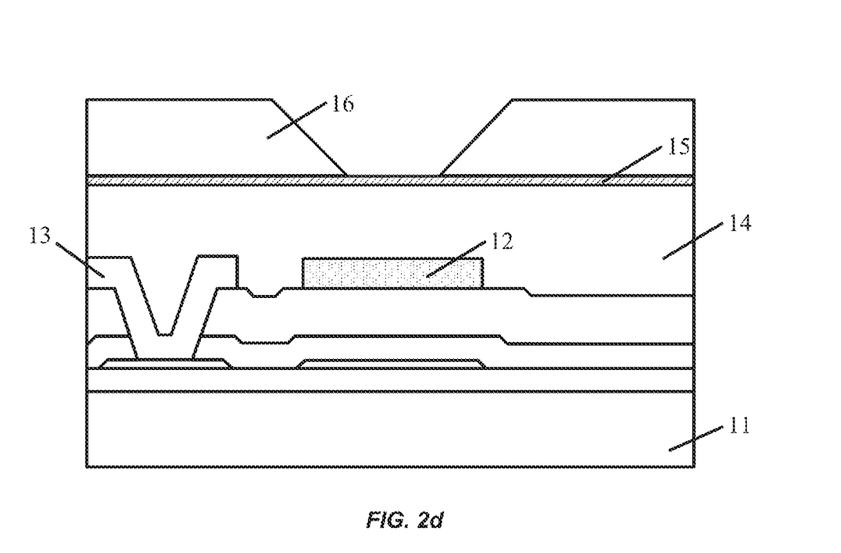

Specifically, Step S104 includes: coating the photoresist layer 16 on the first transparent conductive layer 15, and exposing and developing the photoresist layer 16 by a mask to form the opening of the photoresist layer 16 at a position corresponding to the drain 12. The cross-sectional view of the TFT array substrate formed with the photoresist layer 16 having an opening is shown in FIG. 2d. The formed opening has a trapezoidal sectional shape, and a bottom size of the opening is smaller than a top size of the opening. The bottom size of the opening is determined depending on a desired size of a second via hole 141 to be formed subsequently.

In various implementations of the embodiment of the present disclosure, the photoresist layer 16 is 1.3 to 1.7 times the thickness of the organic layer 14. Further, the photoresist layer 16 is 1.5 times the thickness of the organic layer 14. The thickness of the photoresist layer 16 is typically arranged between 2 μm and 3 μm, and when the thickness of the organic layer 14 is 1.7 μm, the thickness of the photoresist layer 16 is typically 2.5 μm. The reason for this is mainly that an ashing speed of the hardened organic layer 14 is about 600 nm per minute and an ashing speed of the photoresist layer 16 is about 800 nm per minute, thus, in order to prevent the first transparent conductive layer 15 from the impact by oxygen plasma, the thickness of photoresist layer 16 is 1.3 to 1.7 times, preferably 1.5 times the thickness of the organic layer 14.

Step S105: patterning the first transparent conductive layer 15 and the organic layer 14 by using the photoresist layer as a mask to form a first via hole 151 and the second via hole 141.

The first via hole 151 extends through the first transparent conductive layer 15, and the second via hole 141 extends through the organic layer 14. The position of the opening of the photoresist layer 16 corresponds to the positions of the first via hole 151 and the second via hole 141, and the first via hole 151 and the second via hole 141 are in communication with each other.

Figure 2E:
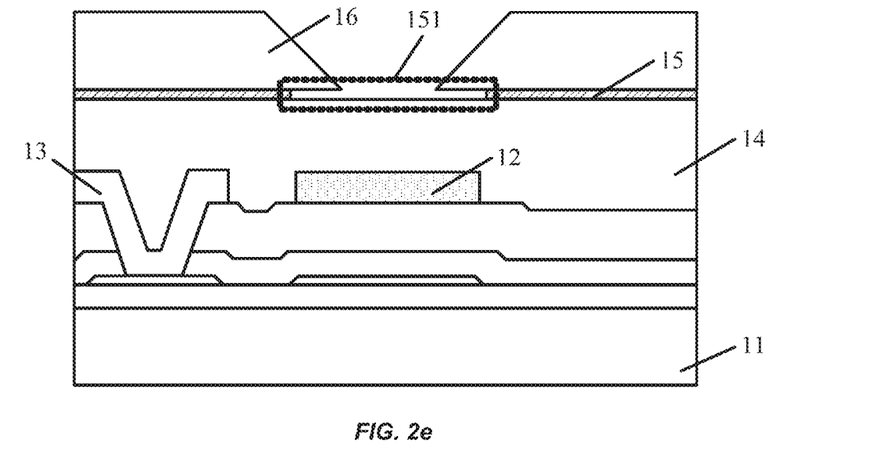

Specifically, the first transparent conductive layer 15 is etched by a wet etching method by using the photoresist layer 16 as a mask to form the first via hole 151, and a cross-sectional view of the TFT array substrate formed with the first via hole 151 is shown in FIG. 2e. As can be seen from FIG. 2e, the size of the first via hole 151 is larger than the bottom size of the opening of the photoresist layer 16, because the first transparent conductive layer 15 is etched by the wet etching method, the wet etching method is an isotropic etching method, so that two sides of the first transparent conductive layer 15 are etched(namely, an etching solution used by the wet etching is horizontally infiltrated into the first transparent conductive layer 15 below the photoresist layer 16), thus the diameter of the first via hole 151 is larger than the bottom size of the opening of the photoresist layer 16. In this step, the etching solution used by the wet etching method may be an oxalic acid solution, and the concentration of the oxalic acid solution and the time for the wet etching may be adjusted as actually desired, thereby controlling the size of the first via hole 151.

Figure 2F:
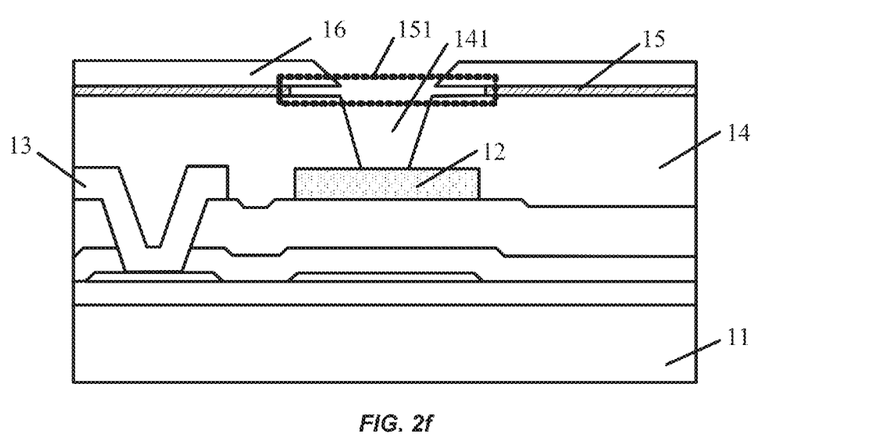

Then, the organic layer 14 and the photoresist layer 16 are ashed by using the photoresist layer 16 as a mask to form the second via hole 141. A cross-sectional view of the TFT array substrate formed with the second via hole 141 is shown in FIG. 2f. Here, the ashing is exampled by oxygen plasma ashing. The ashing is performed along a direction perpendicular to a surface of the organic layer 14. The photoresist layer 16 is made of organic material, and hence is also etched to a certain degree. Since the ashing speed of the organic layer 14 is about 600 nm per minute and the ashing speed of the photoresist layer 16 is about 800 nm per minute, the photoresist layer 16 is 1.3 to 1.7 times the thickness of the organic layer 14 so as to prevent the first transparent conductive layer 15 from the impact by oxygen plasma. After the ashing, a part of the photoresist layer 16 is residual.

Since the first via hole 151 and the second via hole 141 are both etched by using the photoresist layer 16 as a mask, the first via hole 151 and the second via hole 141 are allowed to precisely align with each other due to the common use of the same mask, to effectively avoid such a problem that a short circuit between the first transparent conductive layer 15 and a pixel electrode, the short circuit is caused due to significant misalignment between the first via hole 151 and the second via hole 141 (namely due to the oversize overlapping portion of the first via hole 151 and the second via hole 141), thereby avoiding a phenomenon of continuous defective pixels, ensuring the display quality of a display panel and improving a yield of the display panel. In another aspect, the use of the same mask simplifies technical processes, and the use of the photoresist layer as the mask avoids the use of the two additional masks, thereby saving the cost and improving productivity.

Further, the projection of the first via hole 151 on the substrate covers the projection of the second via hole 141 on the substrate, that is, it can be understood that the size of the first via hole 151 is larger than the top size of the second via hole 141. In Step S105, the first via hole 151 is formed using the wet etching method, the wet etching method is an isotropic etching method, so that two sides of the first transparent conductive layer 15 are etched(namely, an etching solution used by the wet etching is horizontally infiltrated into the first transparent conductive layer 15 below the photoresist layer 16), thus the size of the first via hole 151 is larger than the bottom size of the opening of the photoresist layer 16. Thereafter, the organic layer 14 and the photoresist layer 16 are ashed by using the photoresist layer 16 as the mask to form the second via hole 141. Since the ashing is anisotropic and has an unidirectional effect, the top size of the second via hole 141 is hardly different from the bottom size of the opening of the photoresist layer 16, thus the size of the first via hole 151 is larger than the top size of the second via hole 141.

In Step S105, while the size of the first via hole 151 is larger than the top size of the second via hole 141, the lateral size of the first via hole 151 formed by the wet etching method will not be excessively large since the lateral size of the first via hole 151 can be controlled by adjusting the concentration of the etching solution, so that the case that the via hole of the first transparent conductive layer is much larger than the via hole of the organic layer in the prior art is avoided, thereby improving an electrostatic shielding effect of the common electrode (i.e. the first transparent conductive layer 15). Therefore, a capacitance Cgp between the gate and the pixel electrode is decreased and the load of a common electrode is also decreased, thereby decreasing the power consumption. Furthermore, in a display device of a high resolution and a high aperture ratio, the first via hole 151 is relatively small and does not beyond an area of a black matrix(namely the first via hole 151 is covered by the black matrix, or in other words, the area of the black matrix need not be expanded), which is advantageous for improving aperture ratio of the TFT array substrate and avoiding the trace mura phenomenon.

In addition, in Step S105, while the ashing is an anisotropic process and performed along the direction perpendicular to the surface of the organic layer 14 in the present embodiment, the ashing somewhat has an effect on the wall of the second via hole 14 actually. In this case, if the size of the first via hole 151 is equal to the top size of the second via hole 141, then an undercut is formed at the bottom periphery of the first via hole 151 due to the ashing process is performed for the organic layer 14, thus causing unevenness, thereby affecting the formation of subsequent insulation layer 17 (shown in FIG. 2h) and second transparent conductive layer 18 (shown in FIG. 2h), so that problems such as the residual of first transparent conductive layer 15, disconnection of the second transparent conductive layer 18 (shown in FIG. 2h) and the short circuit between the first transparent conductive layer 15 and the second transparent conductive layer 18 occurs, and hence continuous defective pixels of the display device are presented. In the present embodiment, however, since the first via hole 151 is larger than the second via hole 141, the undercut is avoided in the ashing process performed for the organic layer 14, so that the mentioned above problems are avoided.

Furthermore, after Step S105, the method of manufacturing a TFT array substrate of the embodiment of the present disclosure further includes a step of: forming the insulation layer 17 and the second transparent conductive layer 18 in sequence on the first transparent conductive layer 15 and the drain 12.

The insulation layer 17 overspreads the entire substrate, and includes a third via hole 171 which extends through the insulation layer to expose the drain 12. The second transparent conductive layer 18 is electrically connected to the drain 12 through the first via hole 151, the second via hole 141, and the third via hole 171, and is insulated from the first transparent conductive layer 15 by the insulation layer 17.

Specifically, the insulation layer 17 is formed on the first transparent conductive layer 15, in the first via hole 151 and in the second via hole 141. The third via hole 171 is formed in the insulation layer 17 at a position corresponding to the drain 12, so that the third via hole 171 exposes the drain 12. The second transparent conductive layer 18 is formed on the insulation layer 17, in the first via hole 151, in the second via hole 141 and in the third via hole 171, so that the second transparent conductive layer 18 is electrically connected with the drain 12. The drain 12 is disposed between the substrate and the organic layer 14, and the second via hole 141 exposes the drain 12.

Figure 2G:
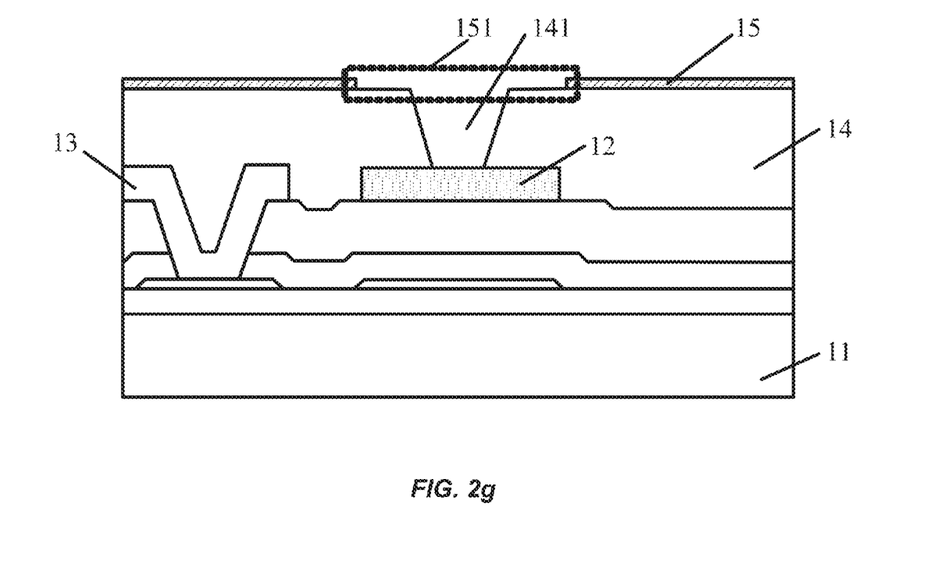

Since a part of the photoresist layer 16 is residual after the photoresist layer 16 is used as the mask for etching in Step S105, the residual photoresist layer 16 is removed after the step of ashing and before the step of forming the insulation layer 17 and the second transparent conductive layer 18. A cross-sectional view of the TFT array substrate after the residual photoresist layer 16 is removed is shown in FIG. 2g.

Figure 2H:
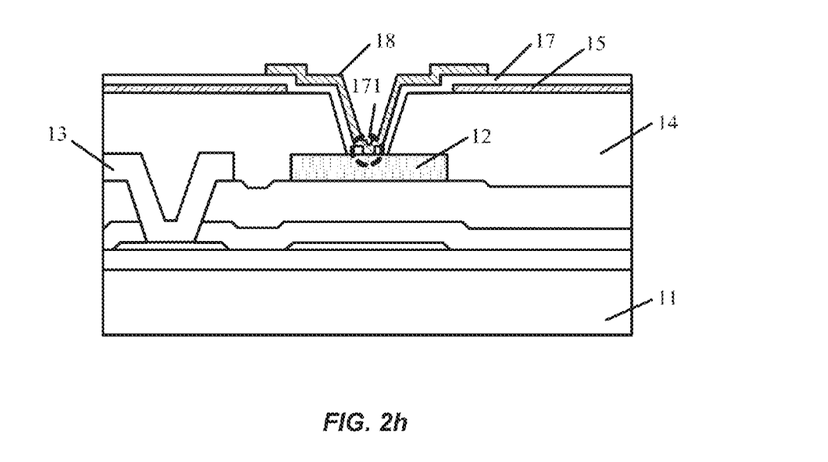

As shown in FIG. 2h, after the residual photoresist layer 16 is removed, the insulation layer 17 is formed on the first transparent conductive layer 15, in the via hole of the first transparent conductive layer and in the second via hole 141, and then the insulation layer 17 is patterned to form the third via hole 171 in the insulation layer 17 at a position corresponding to the drain 12. The size of the formed third via hole 171 is smaller than the bottom size of the second via hole 141, and the third via hole 171 exposes the drain 12. Preferably, both the projection of the first via hole 151 on the substrate and the projection of the second via hole 141 on the substrate cover the projection of the third via hole 171 on the substrate, that is, the size of the third via hole 171 is smaller than the bottom size of the second via hole 141. The insulation layer 17 may be made of silicon dioxide or silicon nitride, but the present embodiment is not limited thereto. The insulation layer 17 may be formed by deposition or epitaxial growth technologies known in the art including, but not limited to, PVD and CVD. Then, the second transparent conductive layer 18, which is electrically connected with the drain 12, is formed on the insulation layer 17 and in the via hole(namely the third via hole 171) of the insulation layer 17. The second transparent conductive layer 18 is made of ITO, IZO, or a combination of ITO and IZO. The first transparent conductive layer 15 may be formed by deposition or epitaxial growth technologies known in the art including, but not limited to, PVD and CVD.

In this method, the TFT array substrate may be an LTPS TFT array substrate or an amorphous silicon TFT array substrate, but not limited thereto.

In the method of manufacturing the TFT array substrate of the present embodiment, the first via hole 151 and the second via hole 141 are precisely aligned with each other by the common use of the same photoresist layer 16 as a mask, to effectively avoid such a problem that a short circuit between the first transparent conductive layer 15 and a pixel electrode, the short circuit is caused due to significant misalignment between the first via hole 151 and the second via hole 141 (namely due to the oversize overlapping portion of the first via hole 151 and the second via hole 141), thereby avoiding a phenomenon of continuous defective pixels, ensuring the display quality of a display panel and improving a yield of the display panel. In another aspect, the use of the same mask simplifies technical processes, and the use of the photoresist layer is used as the mask avoids the use of two additional masks, thereby saving the cost and improving productivity.

Furthermore, with the method of manufacturing the TFT array substrate of the present embodiment, the via hole of the first transparent conductive layer 15 that is formed by the wet etching will not be excessively larger than the via hole of the organic layer 14, thereby improving the electrostatic shielding effect of the common electrode (i.e. the first transparent conductive layer), so that the capacitance Cgp between the gate and the pixel electrode is decreased and the load of the common electrode is also decreased, thereby decreasing the power consumption. Furthermore, in the display device of a high resolution and a high aperture ratio, the size of the first via hole 151 is relatively small and will not beyond an area of a black matrix(namely the first via hole 151 is covered by the black matrix, or in other words, the area of the black matrix need not be expanded), which is advantageous for improving aperture ratio of the TFT array substrate and avoiding the trace mura phenomenon.

As shown in FIG. 2h, the present embodiment further provides a TFT array substrate including: a substrate and a drain 12 disposed on the substrate; an organic layer 14, which is disposed on the drain 12, overspreads the entire substrate and includes a second via hole 141 which extends through the organic layer 14 to expose the drain 12; a first transparent conductive layer 15, which is disposed on the organic layer 14 and includes a first via hole 151 in communication with the second via hole 141; an insulation layer 17, which is disposed on the first transparent conductive layer 15 and the drain 12, overspreads the entire substrate and includes a third via hole 171 which extends through the insulation layer 17 to expose the drain 12; and a second transparent conductive layer 18, which is disposed on the insulation layer 17, the first transparent conductive layer 15 and the drain 12, is electrically connected to the drain 12 through the first via hole 151, the second via hole 141 and the third via hole 171, and is insulated from the first transparent conductive layer 15 by the insulation layer 17. The second via hole 141 and the first via hole 151 are in communication with each other and are coaxial.

Further, the projection of the first via hole 151 on the substrate covers the projection of the second via hole 141 on the substrate, and both the projection of the first via hole 151 on the substrate and the projection of the second via hole 141 on the substrate cover the projection of the third via hole 171 on the substrate. That is, the entire size of the second via hole 141 is smaller than the size of the first via hole 151, and the size of the third via hole 171 is smaller than the entire size of the second via hole 141.

The TFT array substrate may be an LTPS TFT array substrate, an amorphous silicon TFT array substrate, or an oxide TFT array substrate. In an example of the TFT array substrate, the first transparent conductive layer 15 is used as a common electrode, and the second transparent conductive layer 18 is used as a pixel electrode. The pixel electrode is disposed above the common electrode, and is connected to the drain 12 through the first via hole 151, the second via hole 141, and the third via hole 171.

In the TFT array substrate of the present embodiment, the via hole(first via hole 151) of the first transparent conductive layer 15 that is obtained by the wet etching will not be excessively larger than the via hole(second via hole 141) of the organic layer 14, thereby improving the electrostatic shielding effect of the common electrode (i.e. the first transparent conductive layer), so that the capacitance Cgp between the gate and the pixel electrode is decreased and the load of the common electrode is also decreased, thereby decreasing the power consumption. Furthermore, in the display device of a high resolution and a high aperture ratio, the size of the first via hole 151 is relatively small and will not beyond an area of a black matrix(namely the first via hole 151 is covered by the black matrix, or in other words, the area of the black matrix need not be expanded), which is advantageous for improving aperture ratio of the TFT array substrate and avoiding the trace mura phenomenon.

Figure 3:
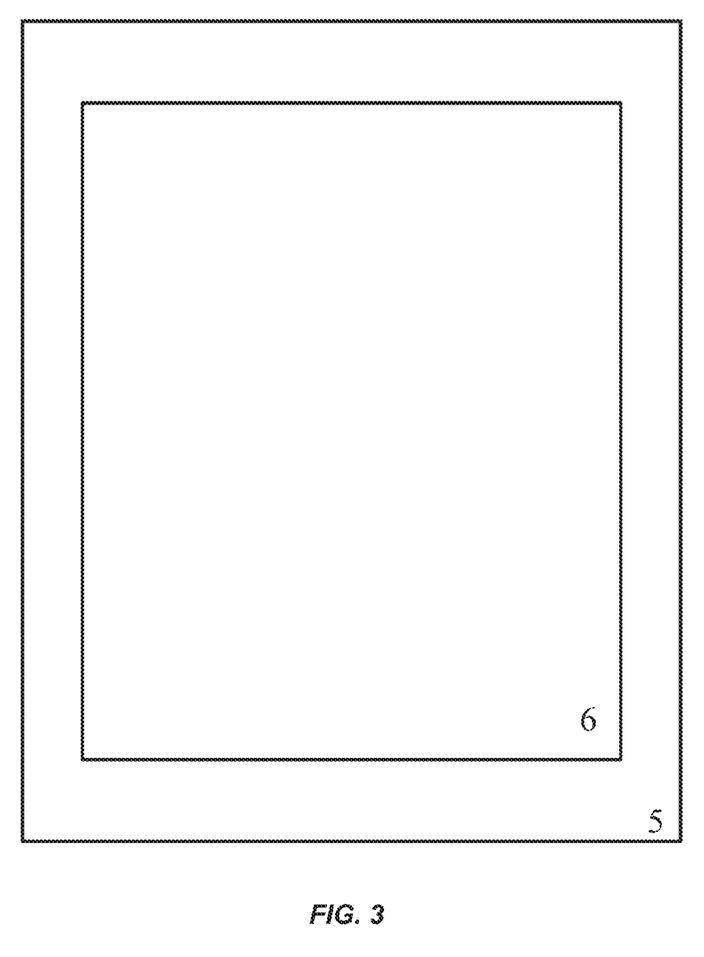
FIG. 3 is a schematic diagram illustrating a display device according to an embodiment of the present disclosure.

As shown in FIG. 3, an embodiment of the present disclosure further provides a display device 5 including a TFT array substrate 6, and the TFT array substrate 6 is embodied by the TFT array substrate as described above. The display device may be, but is not limited to a display device such as a liquid crystal display device, an OLED display and an electronic paper.

The display device with the above TFT array substrate avoids a phenomenon of continuous defective pixels, ensures the display quality of a display panel, improves a yield of the display panel, decreases the power consumption and eliminates the trace mura phenomenon.

The preferred embodiments of the present invention are described as above, but are not intended to limit the present invention. Any modifications, equivalent substitutions, improvements, etc., that are made without departing from the spirit and principle of the present invention should fall into the scope of protection of the present invention.

What is claimed is:

1. A method of manufacturing a TFT array substrate, comprising:
    providing a substrate;
    forming an organic layer comprising a planarized surface layer on the substrate;
    forming a first transparent conductive layer on the organic layer;
    forming a photolithography layer on the first transparent conductive layer, wherein the photolithography layer has an opening;
    patterning the first transparent conductive layer to form a first via hole in the first transparent layer using the photolithography layer as a mask, wherein the first via hole is aligned with the opening in the photolithography layer; and
    patterning the organic layer to form a second via hole in the organic layer using the photolithography layer as a mask after formation of the first via hole, wherein the second via hole is aligned with the opening in the photolithography layer;
    wherein patterning the first transparent conductive layer to form the first via hole further comprises wet etching the first transparent conductive layer; and
    wherein patterning the organic layer to form the second via hole further comprises ashing the organic layer.

2. The method of manufacturing a TFT array substrate according to claim 1, further comprising:
    forming a drain on the substrate,
    wherein, the drain is disposed between the substrate and the organic layer, and is exposed by the second via hole.

3. The method of manufacturing a TFT array substrate according to claim 2, wherein a projection of the first via hole on the substrate covers a projection of the second via hole on the substrate.

4. The method of manufacturing a TFT array substrate according to claim 3, further comprising:
    sequentially forming an insulation layer and a second transparent conductive layer on the first transparent conductive layer and on the drain,
    wherein the insulation layer is disposed on the substrate and comprises a third via hole, the third via hole extending through the insulation layer to expose the drain, and wherein the second transparent conductive layer is connected to the drain through the first via hole, the second via hole, and the third via hole, and is insulated from the first transparent conductive layer by the insulation layer.

5. The method of manufacturing a TFT array substrate according to claim 4, wherein, both the projection of the first via hole on the substrate and the projection of the second via hole on the substrate cover a projection of the third via hole on the substrate.

6. The method of manufacturing a TFT array substrate according to claim 5, wherein, the photolithography layer is between about 1.3 and about 1.7 times the thickness of the organic layer.

7. The method of manufacturing a TFT array substrate according to claim 4, further comprising:
   before forming the insulation layer and the second transparent conductive layer removing the photolithography layer.

8. The method of manufacturing a TFT array substrate according to claim 4, wherein forming the insulation layer and the second transparent conductive layer comprises:
   forming the insulation layer on the first transparent conductive layer, in the first via hole, and in the second via hole;
   forming a third via hole in the insulation layer at a position corresponding with the drain such that the drain is exposed by the third via hole; and
   forming the second transparent conductive layer on the insulation layer, in the first via hole, in the second via hole, and in the third via hole such that the second transparent conductive layer is electrically connected with the drain.

9. The method of manufacturing a TFT array substrate according to claim 4, wherein, the photolithography layer is between about 1.3 and about 1.7 times the thickness of the organic layer.

10. The method of manufacturing a TFT array substrate according to claim 3, wherein, the photolithography layer is between about 1.3 and about 1.7 times the thickness of the organic layer.

11. The method of manufacturing a TFT array substrate according to claim 2, wherein the photolithography layer is between about 1.3 and about 1.7 times the thickness of the organic layer.

12. The method of manufacturing a TFT array substrate according to claim 1, wherein, forming the photolithography layer comprises:
   exposing and developing the photolithography layer with a mask to form the opening.

13. The method of manufacturing a TFT array substrate according to claim 12, wherein, the photolithography layer is between about 1.3 and about 1.7 times the thickness of the organic layer.

14. The method of manufacturing a TFT array substrate according to claim 1, wherein an etching solution used for the wet etching comprises an oxalic acid solution, and wherein the ashing is performed with an oxygen plasma ashing process.

15. The method of manufacturing a TFT array substrate according to claim 1, wherein the photolithography layer is between about 1.3 and about 1.7 times the thickness of the organic layer.

16. A TFT substrate array manufactured according to the method in claim 1, wherein the TFT array substrate further comprising
   a substrate and a drain disposed on the substrate;
   an organic layer, which is disposed on the drain, wherein the organic layer comprises a second via hole, and wherein the second via hole extends through the organic layer to expose the drain;
   a first transparent conductive layer disposed on the organic layer and comprising a first via hole, wherein the first via hole is aligned with the second via hole;
   an insulation layer, disposed on the first transparent conductive layer and the drain, and comprising a third via hole, wherein the third via hole extends through the insulation layer to expose the drain; and
   a second transparent conductive layer, disposed on the insulation layer, the first transparent conductive layer, and the drain, wherein the second transparent conductive layer is connected to the drain through the first via hole, the second via hole, and the third via hole, and is insulated from the first transparent conductive layer by the insulation layer.

17. The TFT array substrate of claim 16, wherein a projection of the first via hole on the substrate covers a projection of the second via hole on the substrate, and both the projection of the first via hole on the substrate and the projection of the second via hole on the substrate cover a projection of the third via hole on the substrate.

18. A display device comprising a TFT array substrate manufactured according to the method in claim 1, wherein the TFT array substrate comprises:
   a substrate and a drain disposed on the substrate;
   an organic layer, which is disposed on the drain, wherein the organic layer comprises a second via hole, and wherein the second via hole extends through the organic layer to expose the drain;
   a first transparent conductive layer disposed on the organic layer and comprising a first via hole, wherein the first via hole is aligned with the second via hole;
   an insulation layer, disposed on the first transparent conductive layer and the drain, and comprising a third via hole, wherein the third via hole extends through the insulation layer to expose the drain; and
   a second transparent conductive layer, disposed on the insulation layer, the first transparent conductive layer, and the drain, wherein the second transparent conductive layer is connected to the drain through the first via hole, the second via hole, and the third via hole, and is insulated from the first transparent conductive layer by the insulation layer.

* * * * *